US006315879B1

(12) United States Patent
Washburn et al.

(10) Patent No.: US 6,315,879 B1
(45) Date of Patent: *Nov. 13, 2001

(54) MODULAR DEPOSITION SYSTEM HAVING BATCH PROCESSING AND SERIAL THIN FILM DEPOSITION

(75) Inventors: Hudson A. Washburn, Santa Clara; Jarrett L. Hamilton, Half Moon Bay, both of CA (US)

(73) Assignee: United Module Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/653,444

(22) Filed: Aug. 31, 2000

Related U.S. Application Data

(60) Division of application No. 08/692,367, filed on Aug. 6, 1996, now Pat. No. 6,139,695, which is a continuation-in-part of application No. 08/511,665, filed on Aug. 7, 1995, now Pat. No. 5,705,044.

(51) Int. Cl.[7] ................................................. C23C 14/34
(52) U.S. Cl. ................. 204/298.25; 204/290.03; 204/298.07; 204/298.09; 204/298.23; 204/298.26; 118/719; 414/217; 414/221; 414/222.01; 414/222.07; 414/222.13
(58) Field of Search ........................ 204/298.03, 298.07, 204/298.09, 298.23, 298.25, 298.26; 414/217, 221, 222.01, 222.07, 222.13; 118/719

(56) References Cited

U.S. PATENT DOCUMENTS

| 4,401,539 | 8/1983 | Abe et al. ............................ 204/192 |
| 4,500,407 | 2/1985 | Boys et al. ........................... 204/298 |
| 4,569,746 | 2/1986 | Hutchinson .......................... 204/298 |
| 4,588,610 | 5/1986 | Yamazaki ............................ 427/583 |
| 4,592,306 | 6/1986 | Gallego ............................... 118/719 |
| 4,636,401 | 1/1987 | Yamazaki et al. .................... 427/572 |
| 4,701,251 | 10/1987 | Beardow ............................. 204/298 |
| 4,717,461 | 1/1988 | Strahl et al. ....................... 204/192.1 |
| 4,724,159 | 2/1988 | Yamazaki ............................ 427/568 |
| 4,756,815 | 7/1988 | Turner et al. ....................... 204/298 |
| 4,786,564 | 11/1988 | Chen et al. .......................... 428/694 |
| 4,810,346 | 3/1989 | Wolf et al. ........................... 204/298 |
| 4,811,684 | 3/1989 | Tashiro et al. ...................... 118/50.1 |
| 4,828,668 | 5/1989 | Yamazaki et al. .............. 204/298.08 |
| 4,869,802 | 9/1989 | Wirz et al. ........................... 204/298 |

(List continued on next page.)

FOREIGN PATENT DOCUMENTS

| 6-73348 | 3/1994 | (JP) . |
| 6-140333 | 5/1994 | (JP) . |
| 6 2060-865 A | 9/1985 | (JP) ................................ 204/298.11 |
| 5-230649 (A) | 9/1973 | (JP) ................................. 204/298.2 |
| 0 2030-757-A | 7/1988 | (JP) ................................. 204/298.2 |

OTHER PUBLICATIONS

Abe et al. "Planar Magnetron Sputtering Cathode With Deposition Rate Distribution Controllability," *Thin Solid Films*, 96:225–233 (1992).

*Primary Examiner*—Rodney G. McDonald
(74) *Attorney, Agent, or Firm*—Townsend Townsend & Crew LLP; Nana Bains, Esq.

(57) ABSTRACT

A flexible, modular thin film deposition machine comprises a number of batch process stations which define a batch process path. At least one of the batch process stations is a thin film deposition station including a serial deposition chamber and an inter-chamber disk transfer mechanism. The disks move in batches along the process path, being individually processed only at the deposition station. Within the serial sputtering chambers of at least one deposition station there is at most partial environmental separation, whereas between different deposition stations the separation is complete. The resulting simplification of the transport mechanism provides for a high throughput rate while simultaneously minimizing contamination of individual thin film layers.

14 Claims, 10 Drawing Sheets

U.S. PATENT DOCUMENTS

| | | | |
|---|---|---|---|
| 4,871,581 | 10/1989 | Yamazaki | 427/571 |
| 4,911,810 | 3/1990 | Lauro et al. | 204/192.12 |
| 4,958,591 | 9/1990 | Yamazaki | 118/723 E |
| 4,971,674 | 11/1990 | Hata et al. | 204/198.12 |
| 5,033,406 | 7/1991 | Lee | 118/500 |
| 5,102,495 | 4/1992 | Maher et al. | 216/67 |
| 5,106,470 | 4/1992 | Takei et al. | 204/192.12 |
| 5,120,625 | 6/1992 | Yamazaki et al. | 430/58.1 |
| 5,126,027 | 6/1992 | Kudo et al. | 204/192.13 |
| 5,145,711 | 9/1992 | Yamazaki et al. | 427/571 |
| 5,174,875 | 12/1992 | Hurwitt et al. | 204/192.12 |
| 5,180,478 | 1/1993 | Hughes et al. | 414/217 |
| 5,183,685 | 2/1993 | Tamazaki | 427/571 |
| 5,186,718 | 2/1993 | Tepman et al. | 29/25.01 |
| 5,215,420 | 6/1993 | Hughes et al. | 414/217 |
| 5,228,968 | 7/1993 | Zejda | 204/298.07 |
| 5,244,554 | 9/1993 | Yamagata et al. | 204/192.2 |
| 5,259,881 | 11/1993 | Edwards et al. | 118/719 |
| 5,260,265 | 11/1993 | Yamazaki | 505/471 |
| 5,262,030 | 11/1993 | Potter | 204/298.2 |
| 5,310,410 | 5/1994 | Begin et al. | 29/25.01 |
| 5,316,864 | 5/1994 | Hedgcoth | 428/611 |
| 5,320,984 | 6/1994 | Zhang et al. | 438/488 |
| 5,512,150 | 4/1996 | Bourez et al. | 204/192.12 |
| 5,705,044 * | 1/1998 | Washburn et al. | 204/298.25 |
| 5,972,184 * | 10/1999 | Hollars et al. | 204/298.09 |

* cited by examiner

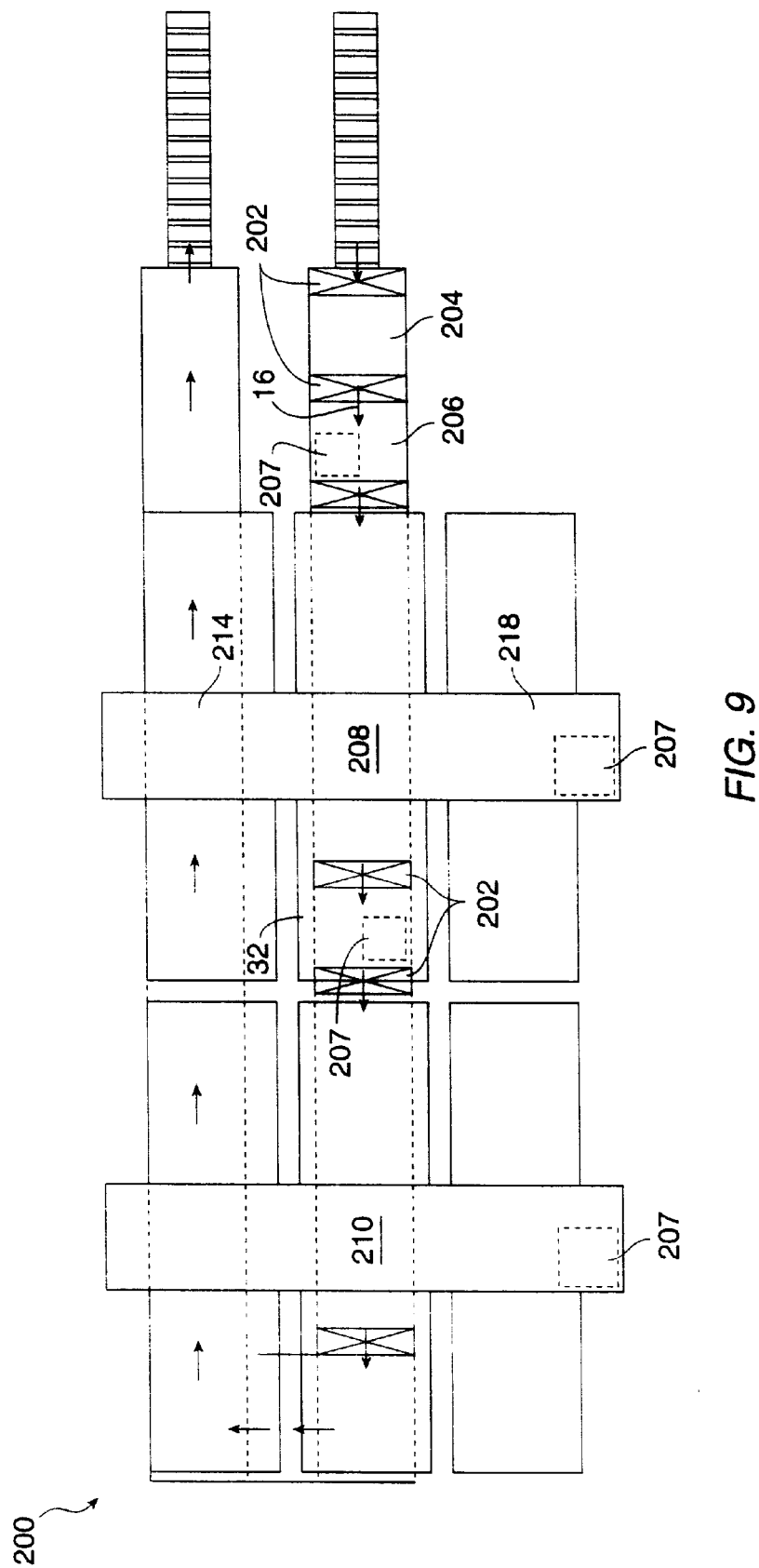

MODULAR DEPOSITION SYSTEM HAVING BATCH PROCESSING AND SERIAL THIN FILM DEPOSITION

CROSS-REFERENCES TO RELATED APPLICATIONS

This application is divisional of and claims priority from U.S. patent application Ser. No. 08/692,367, filed Aug. 6, 1996 now U.S. Pat. No. 6,139,695, which is a continuation-in-part and claims priority from of U.S. patent application Ser. No. 08/511,665, filed Aug. 7, 1995, now U.S. Pat. No. 5,705,044 the full disclosures of which are incorporated herein by reference.

BACKGROUND OF THE INVENTION

1. Field of the Invention

The present invention relates generally to vacuum deposition, and more particularly to a thin film sputtering machine having a batch process path and a serial sputtering chamber.

Sputtering systems generally allow the deposition of a film of a selected material onto a substrate. Sputtering has found increasing applications in the fabrication of integrated circuits from silicon wafers, and particularly in the production of magnetic recording media.

Modern sputtering systems generally include a magnetron which produces a magnetic field in front of the target. The magnetic field intensifies and confines the plasma to a stable region in front of the target, greatly improving the efficiency and deposition rates of the process, and also reducing the heating of the substrate.

There are two types of systems generally used to sputter magnetic recording disks. The first, referred to as a "disk-by-disk" system, produces sputtered films of the highest possible quality. Disk-by-disk systems utilize a serial process method in which each substrate is placed individually between circular magnetrons where a single layer is deposited. The substrate moves sequentially to subsequent sets of circular magnetrons until all desired layers have been deposited. Each substrate must be individually aligned with the sputtering target at a fixed distance and sputtered at a fixed position. The main advantage of the disk-by-disk systems is the circumferential uniformity of the layer structure, which results in uniform magnetic recording characteristics.

Disk-by-disk sputtering systems suffer from serious disadvantages. The serial sputtering process greatly increases costs, in part from the need for a complex handling system to move the disks one at a time from one set of sputtering sources to another. These handling systems also greatly reduce the sputtering system reliability. No increase in through-put is achieved with smaller disks, as a sputtering machine only produces a single product at any given time. Furthermore, the sputtering chamber must be evacuated and back-filled each time it is opened to introduce another substrate. In addition, the mechanical movement from one chamber to another, sealing the chambers, and re-establishing the correct gas environment take a considerable amount of time and substantially limit the throughput rate of known disk-by disk systems.

Other factors limiting the effectiveness of serial sputtering are the requirements of providing separate sputtering chambers for each deposition material, and the need to isolate the deposition materials and chambers from each other during the sputtering process. Typically, the gases used in sputtering some of the layers are different from those used for other layers, and cross-contamination of these gases could reduce the quality of the deposited film strictures. For a typical thin film disk three layer sputtering process, the first underlayer and the magnetic alloy recording layer are preferably sputtered using argon gas, while the carbon overlayer is sputtered using a hydrocarbon/argon or nitrogen/argon gas mixture. This hydrocarbon or nitrogen gas can significantly reduce the coercivity of the magnetic layer if present in the underlayer and magnetic layer process chambers, and/or if absorbed onto the underlayer before the magnetic layer is deposited. Thus, known sputtering chambers are sealed during the sputtering process. However, environment and then (after deposition) turning off the gas, evacuating the chamber, and unsealing the chamber, causes significant delays in the operation of the system. Furthermore, magnetic recording characteristics benefit from a magnetic recording layer sputtered immediately after sputtering an underlayer on the recording media substrate. As noted above, however, the sputtering target and the substrate are preferably axially aligned within the sputtering chamber to provide a uniform film thickness. Thus, the time spent moving the disk from one chamber to the next, aligning the disk, and then sealing the chamber and re-establishing the gas environment, also allows time for the first film layer to be exposed to any contaminating gas, and thereby reduces the quality of the film.

The second type of sputtering system which is generally used to sputter magnetic recording disks is referred to as a "pass-by" system. Pass-by systems utilize a steady-state process in which several substrates are loaded on a pallet and the pallet passes between a series of long rectangular magnetrons which sequentially deposit the desired layers on both sides of the disks. These magnetrons must be separated to prevent cross-contamination. The main advantage of pass-by systems is that several disks an be placed on a pallet and sputtered at one time, and as the size of the disk decreases, more disks can be sputtered at the same time.

Steady-state sputtering deposition processes, in which substrate disks pass through a scanning sputtering stream, result in an undesirable anisotropy of the deposited film. First, pass-by systems deposit a non-uniform film layer due to inherent thickness variations when passing a circular disk by a rectangular target. Additionally, pass-by systems exhibit an angle of deposition variation as the disk approaches the sputtering zone, is directly in front, then leaves the sputtering region. Specifically, some portion of the disk will be sputtered while the sputtering stream is scanning the substrate radially towards or away from the center of the disk. Alternative portions of the disk are sputtered while the sputtering stream is scanning tangentially across that portion of the disk. These non-uniformities result in modulation due to variation in magnetic properties circumferentially around the disk.

Although the anisotropy of pass-by systems can be alleviated to some extent by rotating the disk during the sputtering process, this requires the presence of mechanical moving parts in the harsh environment of the sputtering chamber, and often prevents simultaneous sputtering of both sides of a substrate disk. Disk handling machinery costs are another disadvantage of pass-by systems; to take advantage of the increased throughput when reducing the substrate size, the handling systems used to load and unload the substrates from the pallets often must change to faster, more accurate automated machines which are very expensive. These additional system components decrease the cost advantages of pass-by systems.

A disadvantage of both the pass-by and disk-by-disk sputtering systems is an inherent delay between sputtering successive layers while the disks are moved from one location to another. Magnetic disks generally involve two or more layers, and the quality of the films of upper layers depends on the quality of the lower layers. In particular, an underlayer of chromium or chromium alloy is often used with a cobalt alloy magnetic layer over it. A high coercivity of the cobalt layer is important to achieve high density recording properties. However, if the chrome layer gets an oxide layer on it before the cobalt alloy layer is deposited, the coercivity decreases. Any delay between the end of the chrome sputtering and the beginning of the cobalt sputtering allows some oxide to form, even in a high vacuum, because there is always some residual oxygen in any vacuum system. Thus, the delay inherent between deposition of subsequent layers in both pass-by and disk-by-disk systems limits the recording properties of magnetic recording media.

Another disadvantage of known pass-by and disk-by disk systems is that they are often limited in their throughput rate by the heating and cooling processes. For example, very high heating rates can cause warpage of the substrate. On the otherhand, very high cooling rates are primarily achieved by having a cold surface very close to the disk surface, which is difficult to do without occasionally touching the surface of the deposited film, thereby destroying the disk. Clearly, suing reduced heating and cooling rates extends the process time and thereby reduces throughput rate. It would be desirable to provide some or all of the heating and cooling in a batch process so that the rate per disk could be lowered without reducing the throughput rate for the entire system.

For these reasons it would be desirable to provide improved sputtering deposition methods and devices which provide the benefits of batch sputtering processes, but which would not compromise the sputtering film quality. It would be particularly desirable to provide a flexible sputtering machine which could produce a variety of sputtered layer structures. It would be especially desirable if such a sputtering machine could produce a sputtered layer of a first material, and could immediately sputter a second layer of a second material over the first layer. It would be best if such capabilities could be realized without a large, complex, expensive sputtering apparatus having a large number of moving mechanical parts within the harsh environment of the sputtering chamber.

2. Description of the Background Art

U.S. Pat. No. 5,316,864 describes a steady-state production sputtering machine and describes the anisotropy of "pass-by" recording media. U.S. Pat. No. 4,869,802 describes an apparatus for rotating the substrate during the sputtering process. U.S. Pat. No. 5,228,968 describes a cathode sputtering system having an axial gas distribution. U.S. Pat. No. 5,180,478 describes a sputtering source having a coolant path behind a target. U.S. Pat. No. 4,786,564 describes magnetic recording media which include a sputtered underlayer over which the magnetic layer is immediately sputtered.

SUMMARY OF THE INVENTION

A sputtering machine according to the principles of the present invention comprises a plurality of successive batch process stations. The batch process stations are aligned to define a batch path, each of the process stations including at least one process chamber and a batch driver to advance batches of substrates between successive process stations along the batch path. Valves isolate successive process stations, and are generally provided at the beginning and end of the batch path.

At least one of the process stations comprises a sputtering station which includes a batch chamber along the batch path and an adjacent sputtering chamber disposed adjacent to the batch chamber off of the batch path. The sputtering station further includes an inter-chamber disk transfer mechanism, allowing individual disks to be individually and sequentially moved to and sputtered within the sputtering chamber, while the remaining disks are held in the batch chamber along the batch path. Thus, the disks arc processed and moved between stations in economical batches along much of the process path.

In one embodiment, the disk transfer mechanism of the sputtering machine of the present invention lifts the disk from a cassette upward toward the sputtering chamber. Ideally, the cassettes move horizontally along the batch path, and allow the disk transfer mechanism to select an individual disk for sputtering based on the location of the cassette along the cassette path. These provisions minimize the mechanical complexity of the sputtering machine, allowing the disk transfer mechanism to operate with a single axis of movement, while the sputtering station driver does double duty, performing both as a cassette driver mechanism and as a serial disk sputtering selector, also with only a single axis of movement. This arrangement is facilitated by independently controlling the cassette driver of the sputtering station from the cassette drivers of other process stations.

Preferably, the adjacent sputtering chamber is disposed above the batch chamber, and a heating chamber is disposed above the sputtering chamber. The disks may thus be individually preheated within the heating chamber with a minimum risk of debris from the sputtering chamber falling onto the disk during heating. Additionally, the present disk transfer mechanism is preferably able to cradle the individual disks from below, and to lower the disks back into the cassette so as to avoid articulated parts being subjected to the heating and sputtering chambers.

Advantageously, the individual batch process stations of the present sputtering machine can be formed as "modular" units. As used herein, "modular" means a process station having a standard structural interface at which it is detachably securable to adjacent process stations along the batch path. The sputtering layer structure may therefore be reconfigured by altering the order and number of batch process stations along the batch path. Similarly, the gate valves may be economically produced as modular units and sealingly attached to the adjacent process stations.

A sputtering source according to the present invention comprises an inner sputtering target and an outer sputtering target formed of a different material than the inner target. A concentric coil magnetron is disposed behind the inner and outer targets, the magnetron having at least one inner coil and at least one outer coil.

Selective application of electrical currents to the inner and outer coils of the magnetron vary the magnetic fields produced by the sputtering source of the present invention, allowing selective sputtering of either the inner or outer target. Hence, the sputtering source of the present invention is capable of applying two separate layers of different materials within a single sputtering chamber. No additional mechanical moving parts are required within the harsh sputtering environment. Furthermore, the layers may be applied without any time delay between them, and without any need to open the sputtering chamber, thereby decreasing both the possibility of contamination between sputtered layers and the energy required to evacuate and back-fill the sputtering chamber with sputtering gas. The present sputtering source is particularly advantageous when combined with the present sputtering machine, allowing immediate consecutive sputtering of multiple, high quality film layers on substrate disks which can be pre-treated and post-treated in economical batch groups.

Preferably, at least one of the inner and outer coils of the sputtering source includes a plurality of concentric subcoils. Each of these subcoils has an independent electrical subcurrent, allowing either the first or second magnetic field to vary, thereby sweeping the plasma over the inner or outer target. Such sweeping of plasma greatly improves the target material utilization. Additionally, at least one of the inner target and the outer target of the present sputtering source preferably includes a conical sputtering surface, thereby allowing deposition of uniform layers over a coaxial substrate despite the difference in radial location of the inner and outer sputtering targets. The present sputtering source is particularly well suited for the sputtering of an underlayer directly followed by the sputtering of a magnetic recording layer for production of magnetic recording media.

The present invention further provides a cassette for supporting a plurality of disks. The cassette comprises a first end plate having a bottom edge, a second end plate, and three parallel rods extending horizontally from the first end plate to the second end plate. The rods each include a plurality of notches which are aligned so as to define a plurality of arcs on parallel planes. The rods are positioned so that no notch is more than 90E from a lowest point on the arc. Additionally, no rod is within 10E of that lowest point. The present cassette is particularly well suited for batch processing of disks, allowing convective or forced airflow for heating, cooling, or other processes with minimal interference from the cassette structure, and without binding of the disks against the cassette due to thermal expansion. Additionally, the disks may be lifted from below by a cradle on the end of a blade without interference from any of the three parallel rods.

Preferably, a cassette according to the present invention further comprises a drive bar extending from the first end plate to the second end plate, typically comprising a linear gear rack for driving the cassette along the cassette path of the present sputtering machine. The drive bar may optionally be integrated with one of the three parallel rods. Ideally, the drive bar includes a drive surface which is accessible from beyond the first and second end plates, allowing the cassette to be driven along a cassette path past a drive mechanism which engages the drive surface. The present cassette will preferably hold between five and 100 disks, ideally holding between 20 and 50 disks. The present disk cassette, sputtering machine, and sputtering source provide a simple, flexible, and highly reliable sputtering system which is especially advantageous for the fabrication of high performance magnetic recording media at low cost.

The present invention further provides a method for sputtering a plurality of disks, the method comprising advancing batches of the disks along a batch process path defined by a plurality of successive batch process stations. At least one of the process stations is a sputtering process station. Each batch of disks is isolated at each successive process station by closing valves disposed between the successive process stations. Each batch of the disks is, in turn, isolated within the sputtering process station. Each disk of this batch is individually transferred to an adjacent sputtering chamber disposed off the batch path, where it is sputtered.

Preferably, the lifting step comprises raising the disk through the sputtering chamber to a heating chamber and lowering the heated disk to the sputtering chamber. Generally, the disks are pre-treated as a batch along the path at a pre-treating process station, and are post-treated as a batch along the path at a post-treating process station. Typically, the pre-treating step comprises evacuating air from around the disks and heating the disks within the cassette. Similarly, the post-treating step generally comprises cooling and re-pressurizing the sputtered disks. Preferably, the method further comprises individually lifting each disk from a cassette to an overlayer sputtering chamber at an overlayer sputtering station, where each disk is sputtered with an overlayer.

In another aspect, the present invention provides a thin film deposition system comprising a plurality of deposition stations. Each deposition station includes walls which define batch and deposition chambers. Each deposition station further includes a mechanism to transfer individual substrates between the batch chamber and the deposition chamber. Additionally, the walls of the deposition station arc couplable to at least one adjacent deposition station so as to sealingly surround a batch path. A batch drive system is provided to advance batches of the substrates along the batch path through each deposition station. A plurality of valves pass these batches of substrates, the valves being disposed at a beginning of the batch path, and an end of the batch path, and between the deposition stations so that the batch path is isolatable from the surrounding environment, and also so that the first and second deposition stations are isolatable from each other. Generally, each batch process station is isolatable from adjacent batch process stations during at least a portion of the deposition process.

Oftentimes, at least one of the deposition stations will have a plurality of deposition chambers, each of the chambers adapted for depositing with a common station environment. Hence, the valves along the batch chamber can be used to isolate deposition processes which require different environments, the deposition environments typically comprising at least one of temperature, pressure, and gas composition. This arrangement reduces or eliminates the need to seal the individual deposition chambers during serial deposition of an individual substrate. Production rate of the deposition system can be enhanced by passing the individual substrates entirely through each deposition chamber sequentially. Preferably, the substrates pause when registered with the deposition system, and then continue on to the next chamber. In some embodiments, one or more deposition system run continuously, ideally at a reduced power to limit material deposited during movement of the disk to less than about 10% of the total layer. Advantageously, the deposition chamber can be easily provided with inlets and outlets for such an arrangement without a complicated sealing system, as the entire deposition station remains at a substantially uniform deposition environment. The individual substrates within the deposition station will often follow a circular arc through the deposition chambers. This arc may define either a horizontal or a vertical plane, depending on the specific deposition chamber arrangement.

In another aspect, the present invention provides a thin film deposition station comprising walls defining a batch chamber, a first deposition chamber for deposition of a first film material, and a second deposition chamber for deposition of a second film material different than the first film. The first and second deposition chambers include deposition systems adapted for deposition with a substantially common station environment. A mechanism is coupled to the walls to transfer substrates between the batch chamber and the first and second deposition chambers. At least one valve is couplable to the walls to pass batches of substrates into and out of the batch chamber so that the batch chamber and first and second deposition chambers are isolatable from the surrounding environment. An environmental control system is in communication with the batch chamber, the first deposition chamber, and the second deposition chamber to maintain the station environment.

Oftentimes, the walls will further define at least one individual substrate heating station and additional deposition stations, each generally in communication with, and having a pressure and gas composition which is maintained by, the station environmental control system.

In another aspect, the present invention provides a thin film deposition system comprising a plurality of modular process stations capable of defining a batch path therebetween. Each process station has walls which define a batch chamber along the batch path, and at least two of the process stations comprise deposition stations. Each of the deposition stations also includes a deposition chamber disposed off the batch path and a mechanism for transferring individual substrates from the batch path to the deposition chamber for deposition of a film therein. A plurality of valves are disposable between successive deposition stations, and at a beginning and an end of the batch path. These valves pass batches of substrates, and also isolate the batches of substrates from each other. A batch drive system is provided to advance the batches of substrates along the batch path. Advantageously, adjacent process stations along the batch path are sealable to each other so that the batches of substrates remain isolated from a surrounding environment between the beginning and end of the batch path. Generally, each of the deposition stations are releasably sealable against a plurality of alternative process stations so that a sequence of the process stations along the batch path can be rearranged or additional process stations added, greatly facilitating deposition of alternative film structures on the substrates.

In yet another aspect, the present invention provides a method for depositing a multi-layer film structure on a plurality of substrates, the method comprising advancing the substrates in batches along a batch path defined by a plurality of successive batch chambers. A reduced pressure is maintained along the batch path, the batch chambers being sealed together. Each batch of the substrates is isolated within each of the successive batch chambers by selectively closing valves disposed therebetween. Individual substrates of the isolated batches of substrates arc transferred from a plurality of the batch chambers to deposition chambers disposed off the batch path. The layers are then deposited on the individual substrates within the deposition chambers. Advantageously, the batch chambers may be detached, rearranged in an alternative order and sealed together, so that an alternative multi-layer film structure may be deposited without resorting to an entirely new deposition system.

DESCRIPTION OF THE SPECIFIC EMBODIMENTS

The present invention provides a sputtering machine which is formed as a series of modular processing stations. Each station is isolated from other processing stations and from the outside environment, and is adapted to process a batch of disks carried by a cassette. The process stations are arranged to process each cassette of disks in a particular order. Each cassette travels along a batch path, and is processed at each station consecutively. Although the present sputtering machine will be described with reference to a specific arrangement of processing stations, it is an advantage of the present modular sputtering machine that the process stations can be easily rearranged or stations added or removed to fabricate alternative sputtered layer structures.

The present invention will find use throughout a wide variety of sputtering applications, including the fabrication of integrated circuits from semiconductor wafers. The present sputtering machine will find its most immediate application in the fabrication of magnetic recording media, particularly in the production of rigid magnetic recording disks on aluminum and non-metallic substrates. The present thin film deposition machine allows batch processing of such magnetic recording media during preheating and postsputtering cooling. The disks are individually serially processed only during sputtering of underlayers, magnetic layers, and overlayers, providing the highest possible quality of magnetic recording media at the minimum cost. The present invention thus combines the advantages of batch processing with the high quality of serial sputtering, and avoids the use of complex mechanical manipulators through a novel cassette, cassette driver system, and disk transfer mechanism.

Figure 1:
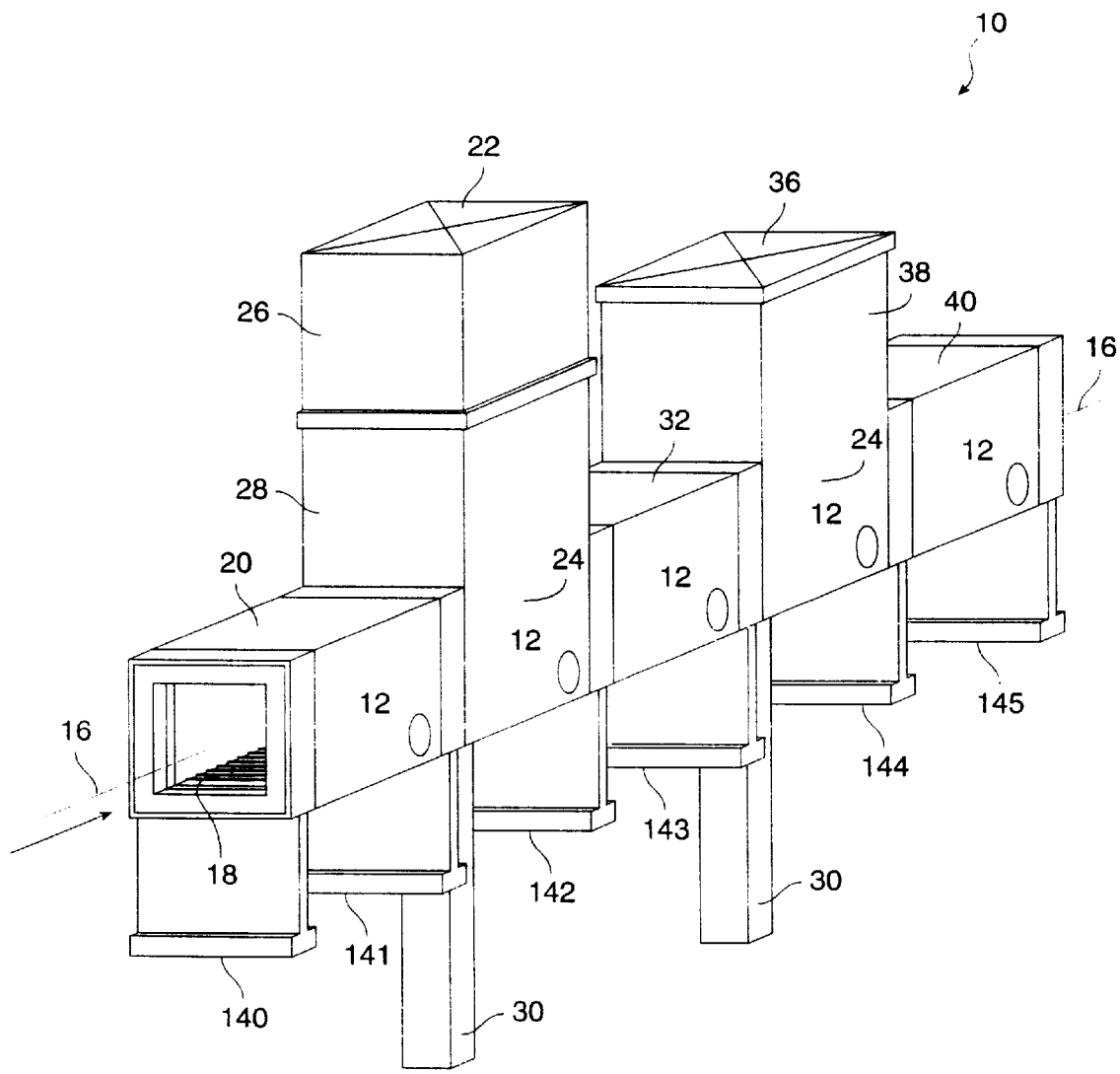
FIG. 1 is a perspective view of a sputtering machine according the principles of the present invention.
Figure 2:
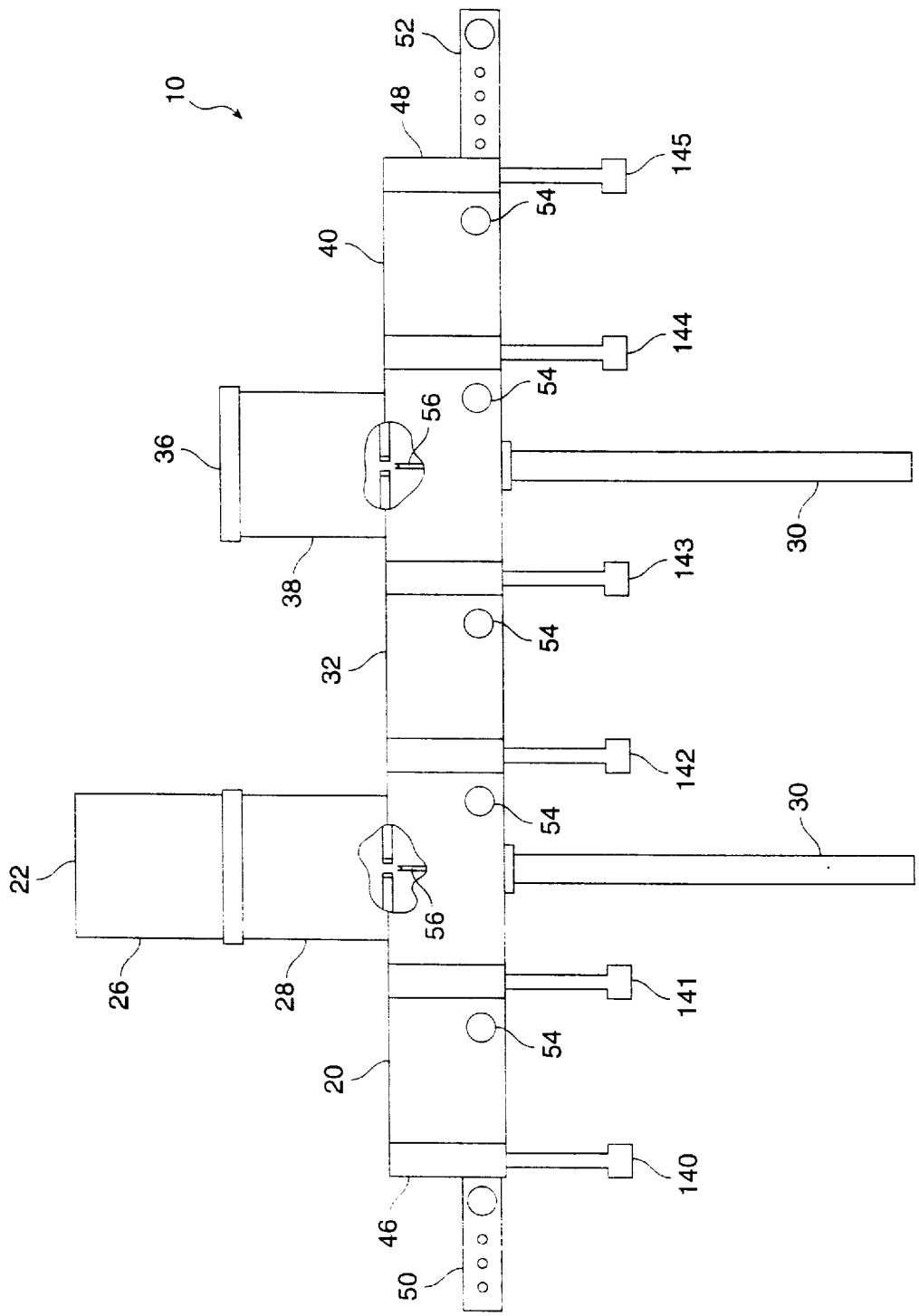
FIG. 2 is a side view of the sputtering machine of FIG. 1, showing the batch process stations, batch path, and interchamber disk transfer mechanisms.

Referring now to FIGS. 1 and 2, a sputtering machine 10 according to the principles of the present invention comprises a series of process stations 12 arranged horizontally. Modular gate valves 140–145 separate each of the process stations, and are also provided at either end of the sputtering machine 10. A batch path 16 extends in a straight line horizontally through batch process stations 12. A cassette driver 18 is included in each process station to advance cassettes along batch path 16. Cassettes of disks are moved from one process station to another by opening a gate valve and advancing the cassette using cassette driver 18.

Cassettes of disks will first be processed in a load and preheat station 20. The cassette of disks is transported into a chamber within preheat station 20 and first and second gate valves 140, 141 are sealed. The atmosphere within the chamber is evacuated to a pressure below about 0.01 mTorr. A flow of heated nitrogen gas is introduced at the top of the chamber and is pumped out from below. Simultaneously, heating lamps on the interior walls of the chamber are turned on. Preferably, the walls are water cooled on the outside to prevent excess heat from reaching the exterior surface of preheat station 20. The disks within the cassette are heated until they attain an average temperature in the range between 50E and 250EC. The disks are then stabilized at the desired temperature with nitrogen gas flow. When the sputtering machine is ready to transfer the cassette of disks to the next chamber, the nitrogen gas flow is turned off and the chamber is again pumped down to below 0.01 mTorr. Preferably, the gas which will be used in the next chamber is then provided in the chamber of preheat station 20. In the sputtering machine of FIG. 1, argon is provided at a pressure equal to the ambient pressure within the adjacent sputtering station. This prevents any contaminating gas from entering the next chamber, and also minimizes any sudden changes in pressure caused by opening second gate valve 141.

After preheating, gate valve 141 is opened and the cassette of disks is transferred into a metals processing station 22. Metals processing station 22 is a sputtering station which is particularly well suited for sputtering an underlayer and a magnetic recording layer for magnetic recording media. Metals processing station 22 includes a cassette chamber 24, a heating chamber 26, and a sputtering chamber 28. Inter-chamber disk transfer mechanism 30 is provided to move the disks between the chambers of metal processing station 22.

The cassette of disks are maintained at an elevated temperature within cassette chamber 24 by additional heaters along the chamber walls. Individual disks are lifted from the cassette and raised through sputtering chamber 28 to heat chamber 26. The temperature of the disk is raised to the desired process temperature, generally being between 220E and 300EC. This rise in temperature will take between 0.5 to 3.0 seconds. The temperature of each disk is measured by a non-contact sensor either before lifting or along the lift path, and the measured temperature is used to determine the power supplied to the heater, so that the disks will have a consistent temperature after the individual heating process.

Once the desired process temperature has been achieved, the disk is lowered into sputtering chamber 28. An underlayer, typically comprising chromium, is generally sputtered first, preferably followed immediately by a magnetic recording layer using the concentric target sputtering source described hereinbelow. Alternatively, a single metallic layer is sputtered, and additional metal processing stations 22 are provided. The sputtering of the underlayer and magnetic layer typically takes between 1.5 and 5.0 seconds for each disk. After the underlayer and magnetic layer are sputtered, the disk is lowered back into the cassette by disk transfer mechanism 30. This process is repeated for each disk within the cassette.

Once each disk in a cassette has been sputtered within metals processing station 22, the gas and pressure within the third process station are adjusted to match those of the metals processing station and third gate valve 142 is opened to allow access to the third process station, a cooling process station 32. It serves to cool the disks, and also to isolate the two sputtering chambers. After the cassette enters and the gate valve is closed, the cooling process chamber is evacuated and back-filled with a thermal transport gas, preferably helium, argon, or nitrogen, at a pressure in the range between 10 and 1000 mTorr. Preferably, the walls of cooling process station 32 are cooled by means of a refrigerant, while the thermal transport gas efficiently transfers the cooling to the disks. The disks are generally cooled to a temperature in the range between 0E to 100EC, in a time ranging between two and five minutes. When the desired temperature is reached, cooling process station 32 is evacuated and then back-filled with the gas and pressure found in the next chamber. Once again, when the cassette is ready, the fourth gate valve 143 opens to provide access to the next chamber and the cassette is advanced using a cassette driver.

The cassette is next advanced into a carbon sputtering station 36 having a cassette chamber 24 and an interchamber disk transfer mechanism 30 similar to metal processing station 22, described above. Here, disk transfer mechanism 30 lifts the disk directly into a carbon sputtering chamber 38. The disk is sputtered and then lowered into the cassette. Time for processing each disk is typically in the range between four and ten seconds. No heat chamber need be provided for the sputtering of carbon, which benefits from lower sputtering process temperatures. Once all disks in the cassette have been sputtered, the cassette is ready to advance to the next process station, as described above.

The final process station is an exit lock 40. Once a cassette is sealed within exit lock 40, the exit lock chamber is vented with nitrogen, bringing the pressure up to atmospheric. The final gate valve is opened and the cassette is transferred outside of sputtering machine 10. After the final gate valve is closed, the chamber is pumped down to below 0.001 mTorr, and back-filled with the same gas and pressure as exists in carbon processing station 36. The exit lock is then ready for the next cassette.

As most clearly seen in FIG. 2, sputtering machine 10 provides a horizontal batch process path. Each process station is preferably isolated by gate valves 141–144, and each typically includes an environmental control system for controlling at least one of temperature, pressure, internal gas composition, and the like. The process path further includes an entry valve 140 and an exit valve 145 to isolate the path from the external environment. The entry and exit valves are subjected to larger pressure differences than the other gate valves, and are optionally different in structure. Typically, an inlet conveyor 50 and an exit conveyor 52 transport loaded cassettes to and from sputtering machine 10.

While inside sputtering machine 10, the cassettes are driven along the batch path by independently controlled driver motors 54. Each driver motor 54 preferably comprises a stepper motor. Alternatively, feedback on the location of cassettes is generally provided. The cassettes may be advanced by a wide variety of mechanisms, including conveyor belts, powered rollers, linear screws, rotating ball drives, and the like. Preferably, at least one pinion at each process station engages a drive bar on the cassette, as described hereinbelow. To transport individual disks between chambers, an extendable blade 56 lifts a disk from the cassette, holding only the lower portion of the outer diameter. Driver motor 54 of each sputtering station controls which disk is lifted by selectively positioning the cassette along the path. Clearly, a wide variety of transport mechanisms and cassette structures could be used to hold and/or translate the batch of cassettes along the batch path.

Figure 3:
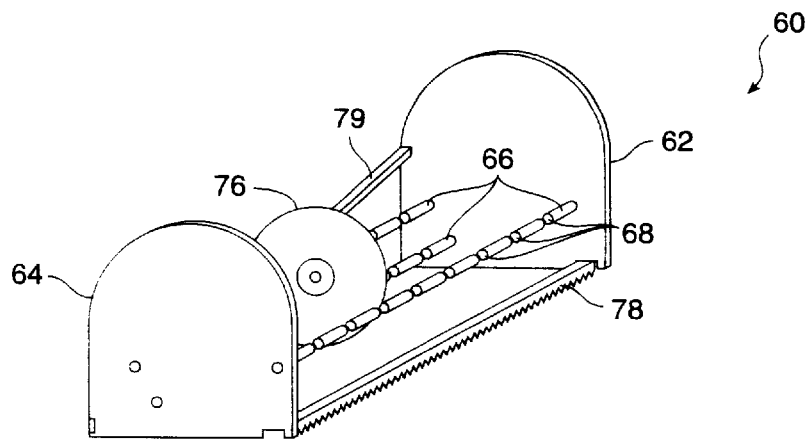
FIGS. 3, 4, and 4A illustrate a disk holding cassette according to the present invention.
Figure 4:
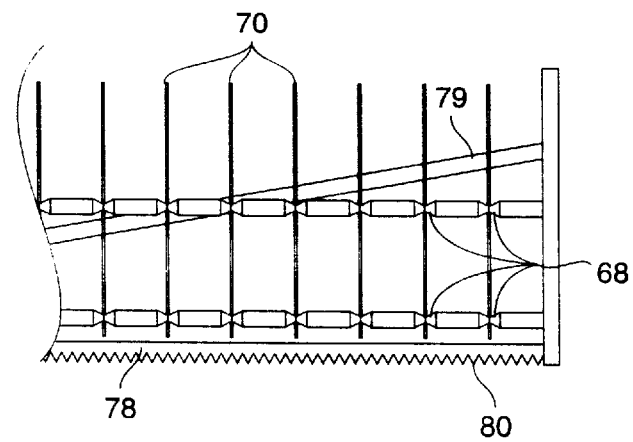
Figure 4A:
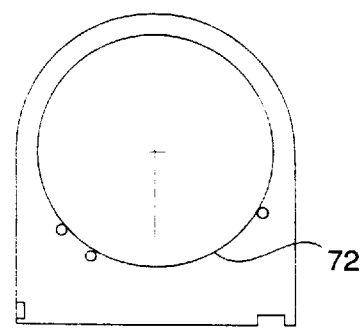

Referring now to FIGS. 3, 4, and 4A, a preferred cassette 60 comprises a first endplate 62, a second endplate 64, and three rods 66 between the endplates. Each rod includes a series of evenly spaced notches 68, so that the notches of the three rods define a series of vertical planes 70. The notches further define arcs 72 on each plane 70. Preferably, no rod is located within 10E of a lowest point 74 on arc 72 to provide access for blade 56 to lift each disk 76. Similarly, so long as no rod is more than 90E from lowest point 74, disk 76 may be lifted straight upward without interference. A drivebar 78 having drivegears 80 allows positive movement of the cassette along the path. The drivegears are accessible without interference from the endplates. Optionally, one or more cross-members 79 connect the endplates to increase rigidity and stability. Cross-member 79 is disposed outside disk holding rods 66 so as to avoid interference with the disks and disk transfer mechanism.

Cassette 60 comprises a material which will withstand the batch process temperatures of sputtering machine 10 without degrading, and is preferably made of metal, ideally comprising polished stainless steel or a polyamide material such as VespalJ. Similar materials should be used for the rods and endplates to avoid differential thermal expansion. Advantageously, cassette 60 holds disks firmly without binding as they expand.

Figure 5:
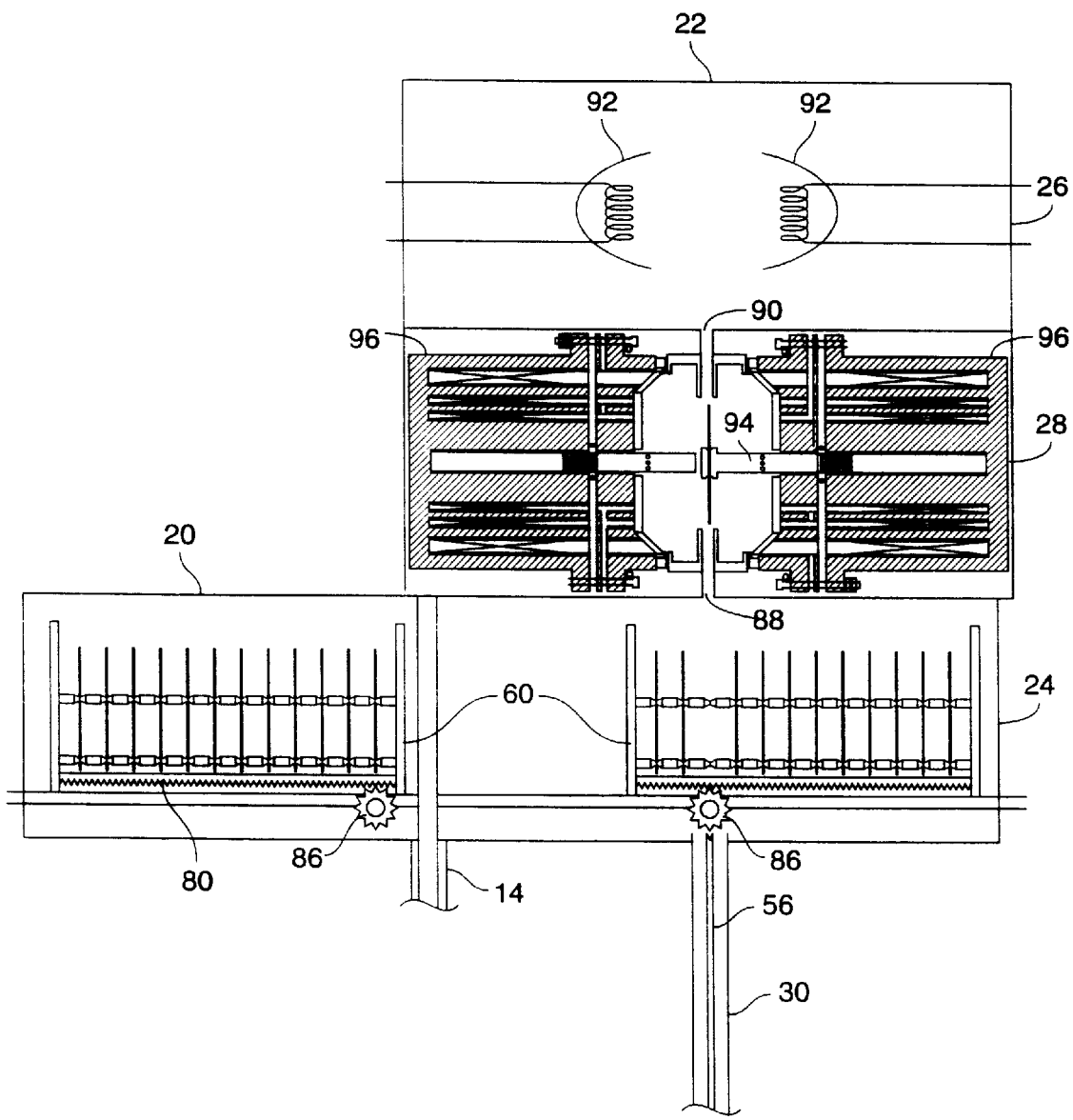
FIG. 5 is a schematic cross-section of a pre-treating station and a sputtering station of the sputtering machine of FIG. 1.

Referring now to FIG. 5 cassettes 60 are advanced along the cassette path by pinions 86, which engage drive gears 80. Drive gear 86 of metals processing station 22 further interacts with disk transfer mechanism 30, as described above. Blade 56 lifts a selected disk through an opening 88 in the cassette chamber 24 to sputtering chamber 28, and through a second opening 90 to heat chamber 26. Heaters 92, typically comprising quartz heater lamps or the like, are preferably turned on before the disk is in position, thereby minimizing heat time. The disk is supported from the outer diameter by blade 56 during heating.

The disk is lowered to sputtering chamber 28 by blade 56, where it is preferably engaged by an inner diameter disk holder 94. The blade may then be lowered, as shown in FIG. 5. Alternatively, the disk is sputtered while held from the outer diameter by blade 56. In either case, an underlayer is sputtered on both sides of the disk using opposing concentric coil magnetrons 96. The underlayer typically comprises chromium, and is generally sputtered to a thickness of 30 to 100 nanometers.

The magnetic layer is sputtered over the underlayer by varying the magnetic field produced by a concentric coil magnetron 96, without any requirement for mechanical movement within sputtering chamber 28. The magnetic layer typically comprises an alloy of cobalt, generally sputtered to a thickness of 30 to 60 nanometers. Sputtering both layers will typically require between about 1.5 to 5.0 seconds. The disk is then lowered by blade 56, and the cassette advanced by drive gear 86 to the next disk. The total time for processing each disk within metals processing station 22 is about 5 to 15 seconds.

Figure 7:
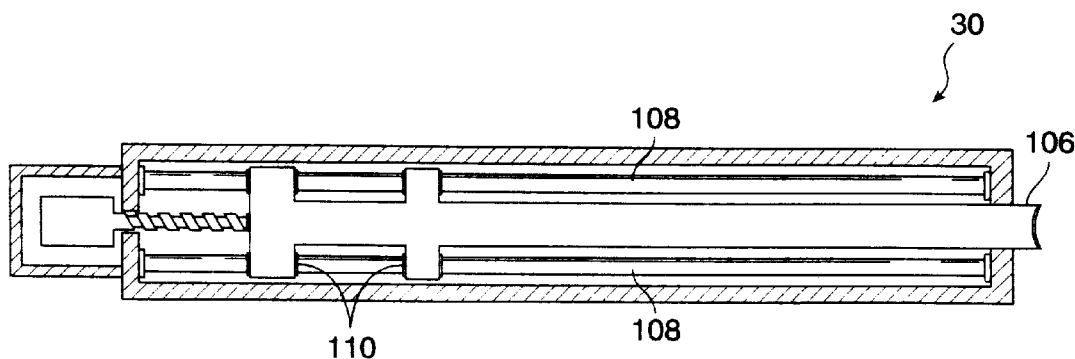
FIGS. 6 and 7 illustrate orthogonal cross-sections of a preferred disk transfer mechanism for use with the sputtering machine of FIG. 1.
Figure 6:
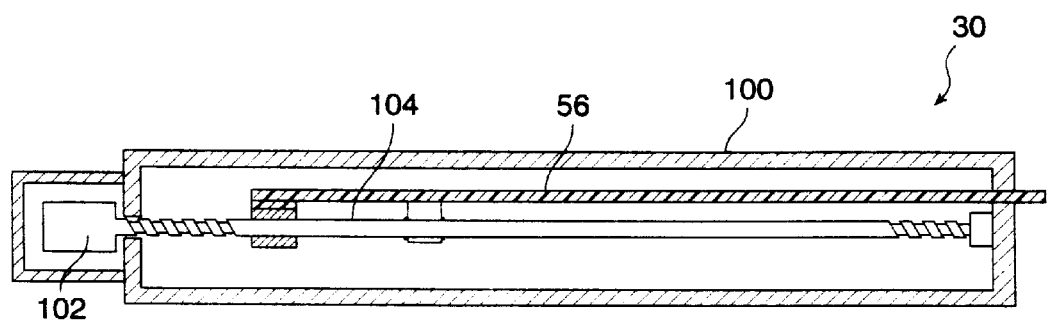

Referring now to FIGS. 6 and 7, blade 56 of interchamber disk transfer mechanism 30 is driven axially by a linear screw 104. Linear screw 104, in turn, is rotated by a stepper motor 102, so that a cradle 106 at the upper end of blade 56 advances upward or downward. The blade is supported by rods 108 and sliders 110, which are affixed to housing 100. Clearly, a wide variety of alternative actuation mechanisms may also be used, including hydraulic or pneumatic pistons, recirculating ball screws, drive belts, or the like.

Figure 8:
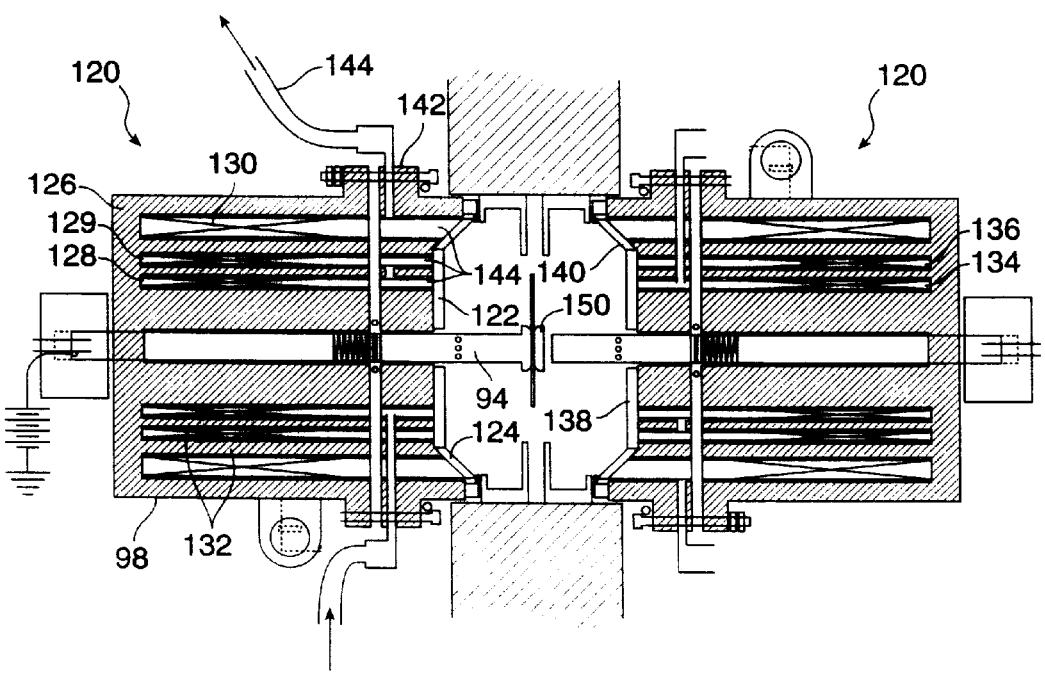
FIG. 8 illustrates two opposed sputtering sources having inner and outer sputtering targets, according to the principles of the present invention.

Referring now to FIG. 8, a sputtering source 120 according to the present invention includes an inner target 122 and an outer target 124. Concentric coil magnetron 96 includes a plurality of concentric magnetic coils having separate power supply connections. As more fully explained in U.S. patent application Ser. No. 08/416,011, filed Apr. 3, 1995 now abandoned, the full disclosure of which is hereby incorporated by reference, varying the current supplied to two concentric magnetic coils of such a sputtering source varies the location of the stable plasma region in front of a target. For example, applying a constant current to an inner coil and applying a constant current which is opposite in orientation (or negative) to the outer coil will result in a stable plasma region which is further in toward the center of the target than is produced by the inner coil alone.

Inner and outer targets 122, 124 of sputtering source 120 are generally in the form of concentric rings. Concentric coil magnetron 96 is radially symmetrical and is located coaxially with the targets. Concentric coil magnetron 96 will include a body 126 of magnetic pole material, a first inner subcoil 128, a second inner subcoil 129, and an outer coil 130. Between each of the coils are middle poles 132 formed of magnetic pole material. Suitable magnetic pole materials include iron, magnetic steel alloys, 410 stainless steel, 1013 steel, and the like. Middle pole widths will be different for different sputtering sources, the exemplary middle pole being in the range from 0.25 to 0.5 inches wide. First inner subcoil 128, second inner subcoil 129, and outer coil 130 will have independent electrical power supplies.

During sputtering, concentric coil magnetron 96 will confine a region of plasma in front of either inner target 122 or outer target 124. A controller applies current independently to the coils so that the magnetic fields of the inner and outer coils combine to confine the plasma together. In the manufacture of magnetic thin film disks, the outer target 124 is preferably chromium or a chromium alloy and the inner target is preferably a cobalt alloy. Generally, the cobalt alloy target is more expensive and a higher utilization of this target is therefore preferred. Using two subcoils beneath the cobalt alloy target allows a greater utilization of the target material, as described more fully in U.S. patent application Ser. No. 08/416,011. This is more economical in use of the target, and also extends the life of the target so as to increase the time between target changes. Optionally, multiple subcoils could also be used beneath the chromium or chromium alloy target to improve its utilization and life. Optionally, the chromium (or other underlayer material) could be used as the inner target, and the cobalt alloy target could be used as the outer target.

To sputter inner target 122, first inner subcoil 128 is supplied with current so as to produce a first radial magnetic field directed outward (called the positive direction) above the target. This first magnetic field will be directly above the inner most coil, and will have a magnitude of at least about 200 Oe. Meanwhile, current is supplied to the second inner subcoil 129 so as to produce a second magnetic field above the second inner subcoil which oscillates in orientation between being positive and being negative (directed radially inward), the second field ideally varying between about −50% to about +100% of the strength of the first field. Current is preferably also supplied to outer coil 130 to produce a weak third magnetic field which is negative in orientation, the third field being located above the outermost coil and being much less than half the strength of the first field.

As the current through the second inner subcoil oscillates between positive and negative, the plasma will move between being positioned above the middle coil and being positioned above the innermost coil, respectively. Since inner target 122 covers both of these locations, the sputtering throughout these oscillations will be limited to the inner target material. The plasm oscillations will develop a wide erosion area covering the region between the two coils.

To sputter the outer target 124, the current through the first and second subcoils 128, 129 are set to zero and a positive current is applied to the outer coil 130. The plasma then is positioned above the outer coil, and thus sputters material from the outer target only. The positive and negative orientations may alternatively all be reversed throughout the above description.

During the processing of a disk with the concentric target arrangement, one of inner target 122 and outer target 124 is sputtered on a substrate, followed immediately by the other. Some small amount of material from each target is sputtered onto the other target surface, thereby presenting a possibility of cross-contamination. Assuming that inner target 122 is sputtered first and outer target 124 is sputtered second, deposition of the outer target material on the inner target surface causes little problem, since the first sputtering of the inner target consists of the outer target material and this just continues the earlier deposition of the outer target material on the substrate. However, a subsequent disk could suffer from cross-contamination from inner target material which remained on the outer target.

Certain actions can be taken to remove the effects of cross-contamination. Preferably, the outer target is re-sputtered for a very short time to clean up the outer sputtering surface before the subsequent disk is positioned within the chamber. This prepares the outer target surface for deposition of uncontaminated outer target material on the next substrate. Re-sputtering can occur with the previously processed disk still in the chamber, in which case a very thin film of the outer target material may be overlaid onto the disk, or it may occur after removing the processed disk and prior to introducing the subsequent disk in the chamber.

The targets of the sputtering source preferably include an outer sputtering surface 140 and an inner sputtering surface 138 which are at an angle relative to each other to compensate for their different radial locations, so that the substrate will receive a radially uniform film thickness from each target, and at the same time achieve a maximum deposition rate from each target. Only one erosion diameter on a flat target surface will produce an adequate uniformity of deposition on the substrate while maximizing the deposition rate. Since the inner target erosion diameter is preferably chosen to fit this requirement, the outer target, which is at approximately the same axial distance from the substrate, is preferably conical to both maximize the deposition rate—because the deposition rate generally follows a cosine law and is highest near the normal direction from the target—and also to achieve adequate film uniformity.

A pole cap 142 is disposed between the inner and outer targets and the coils. Pole cap 142 includes transition poles extending from middle poles 138 to the targets so as direct the magnetic fields towards the desired erosion areas. Hence, a cooling water path 144 within pole cap 142 concentrates cooling at the rear surface of the targets.

Optionally, inner diameter disk holder 94 extends axially from at least one of the two opposed sputtering sources 120. Disk holders which extend from both sputtering sources may capture the disk between them. Alternatively, an inner diameter engaging mechanism 150 firmly holds the disk in the required orientation. Inner diameter disk holder 94 further provides an axial sputtering gas supply and/or return path, ensuring the uniformity of the sputtering film thickness.

Referring now to FIG. 9, an alternative deposition system 200 is shown in plan view. In this arrangement, the process stations are again arranged horizontally along a batch path 16, which here includes a return tunnel so that the batches of substrates may be loaded and unloaded from adjacent positions. Once again, gate valves isolate each of the process stations from the adjacent process stations, and the entire batch path is sealed between the first and last of the gate valves.

In the embodiment shown in FIG. 9, gate valves 202 isolate a load chamber 204 and a pre-heat chamber 206. These chambers are independently optimized for evacuating and raising the temperature of the batches of substrates. The pre-heat station 206 also includes an environmental control system 207 (shown schematically) which is capable of matching the environment of an adjacent deposition station, here vertical plane metals deposition station 208. A cooling station 32 is again disposed between deposition stations, while vertical plane carbon deposition station 210 shares many of the structural features of metal station 208, but includes systems which are adapted for deposition of carbon protective overcoats.

Figure 9A:
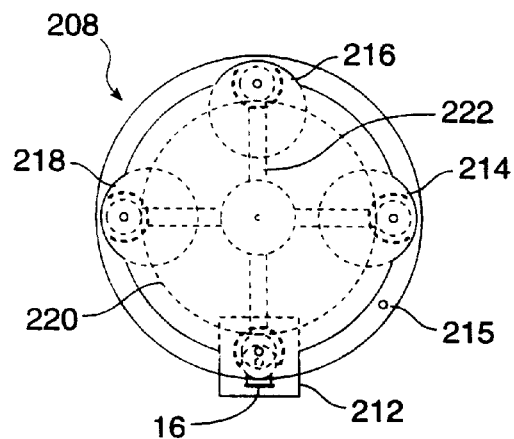
FIGS. 9–9B illustrate an alternative embodiment of a sputtering system according to the principles of the present invention, in which the individual substrates pass through a plurality of deposition chambers along a circular arc in a vertical plane at each of the deposition stations.

The arrangement of the deposition chambers is shown schematically in FIG. 9A. A batch chamber 212 contains the batches of substrates travelling along the batch path 16. A pre-heat chamber 214, underlayer sputtering chamber 216, and a magnetic layer sputtering chamber 218 are all arranged along an arc 220, the arc defining a vertical plane passing through the batch chamber 212. A non-contact temperature sensor 215 provides feedback for the heater within pre-heat chamber 214 to adjust the heater output for that specific substrate, thereby providing consistent substrate deposition temperatures.

To transfer the individual substrates from the batch chamber and through each of the pre-heat, underlayer deposition, and magnetic layer deposition chambers, the metals deposition station 208 makes use of a rotating interchamber disk transfer mechanism 222. Advantageously, this rotating transfer mechanism or "spider" includes arms for each of the sequential process chambers through which the disk will pass (including the batch chamber). This allows simultaneous operation of the pre-heat, underlayer sputtering, and magnetic layer sputtering systems, all while a sputtered disk is being unloaded from the spider 212, and an unsputtered disk is being loaded thereon. As the heating and deposition within metals deposition station 208 takes place at a substantially uniform gas pressure and composition, each of the deposition chambers may be arranged as a pass-through chamber in which the spider arm and substrate enter from one direction and leave from another. Although no complex deposition chamber sealing mechanism is required, the spider mechanism and chamber walls may cooperate to substantially block cross-contamination of sputter particulates.

To maximize throughput of deposition system 200, the sputtering system at each deposition chamber may run continuously during rotation of the spider between chambers. Preferably, the disks will rotate into position in front of the sputtering source while the system is operating at a reduced power to minimize film anisotropy. Generally, so long as less than about 10% of a layer is deposited while the disk is in transition (the remainder being deposited while the disk is held motionless in front of the sputtering source), the beneficial magnetic properties of serial thin film deposition are substantially maintained.

Figure 9B:
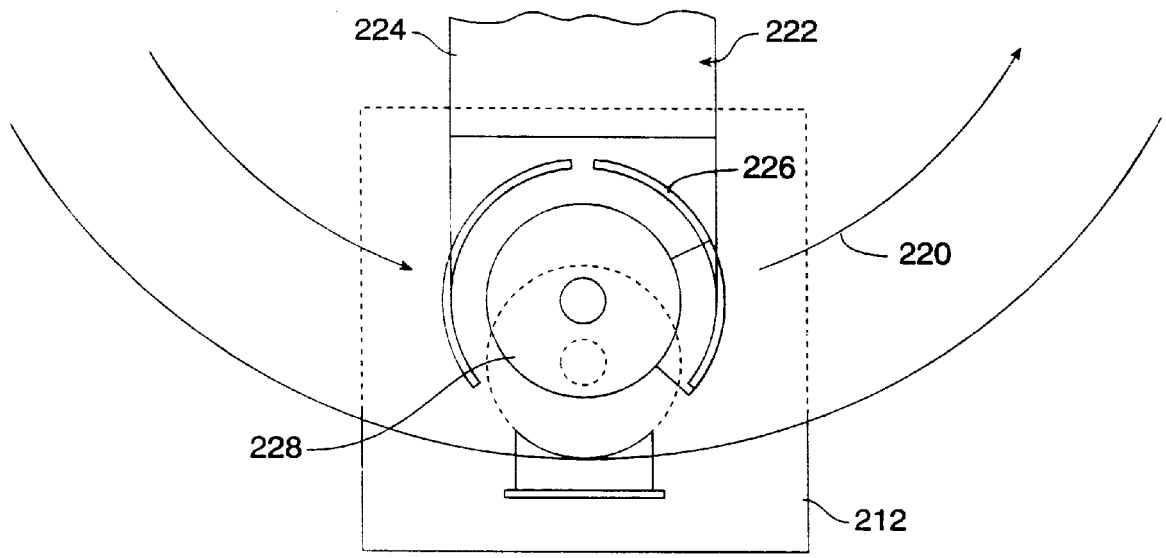
Figure 10:
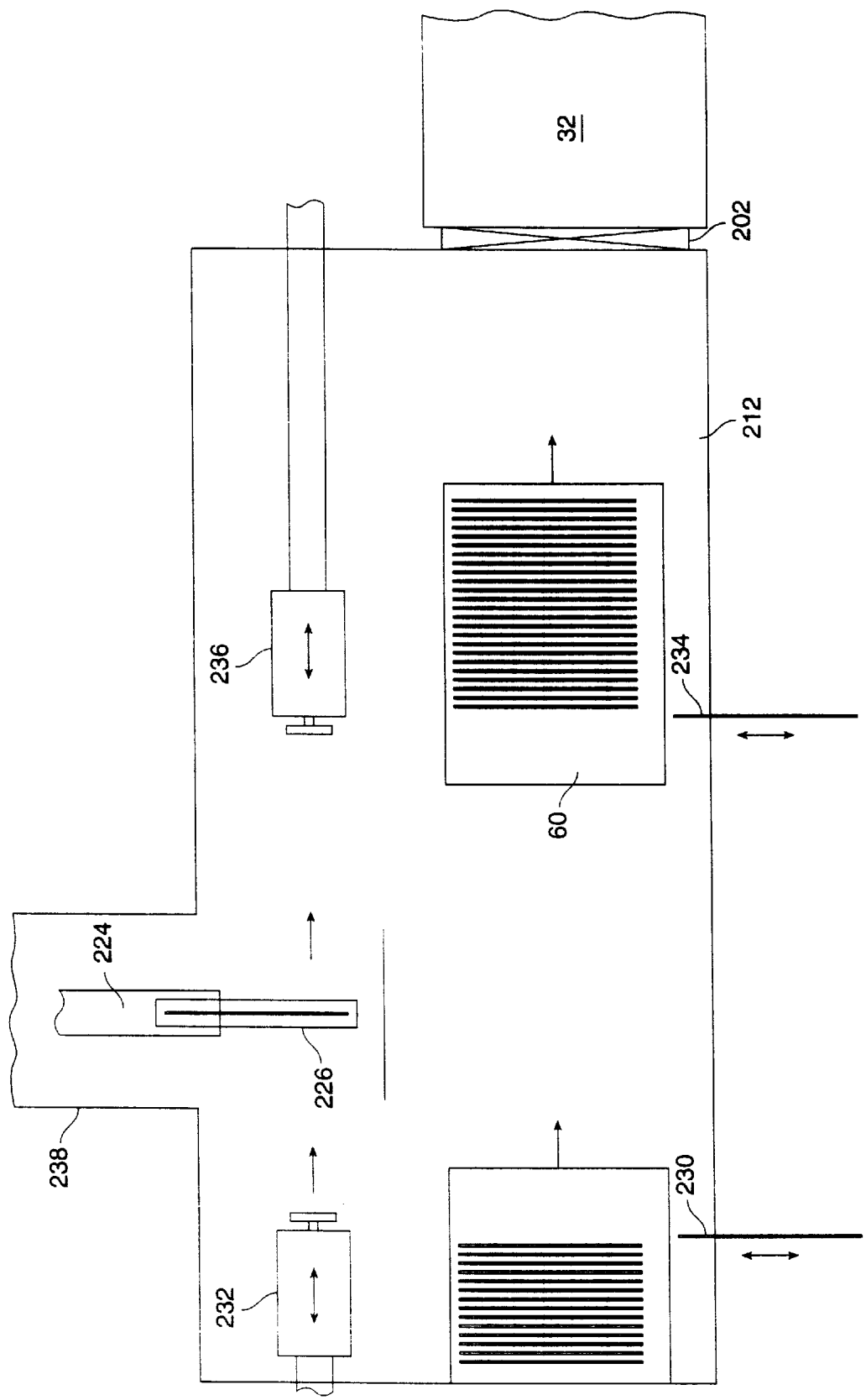
FIGS. 10 and 11 illustrate alternative arrangements for loading and unloading of the individual disks from the batch of disks within the batch chamber of the deposition station.

Referring now to FIG. 9B, spider 222 includes a plurality of arms 224 supporting substrate grippers 226. Preferably, grippers 226 securely hold substrates 228 from the outside, so that the substrates may be heated and have films deposited on both sides without releasing the substrates individually at each deposition chamber. While it may be possible to arrange the batch path so that the grippers of each spider arm transfer substrates directly to and from the cassette as described above, it will generally be advantageous to include separate load and unload actuators for the interchamber disk transfer mechanism. This allows simultaneous loading and unloading of the cassettes to and from the gripper. One such arrangement is shown in FIG. 10, in which a load blade 230 (similar in operation to blade 56 described above regarding FIG. 2) lifts disks from a first cassette disposed within the batch chamber of the deposition station. An ID load gripper 232 transfers the selected disk from road blade 230 to gripper 226. Once a sputter disk returns to the batch chamber an unload ID gripper 236 transfers the sputter disk to an unload blade 234, which then lowers the disk to a second cassette also disposed within the batch chamber. Advantageously, these load and unload operations may be performed simultaneously.

Also shown in FIG. 10 is the circular chamber 238 through which the leg 224 of the spider passes. Conveniently, the gripper mechanism may be similar to those of known deposition systems. Optionally, the load and unload grippers 232, 236 may be replaced by mechanisms which grip the outer diameter of the substrates, particularly where the substrates include no central passage.

Figure 11:
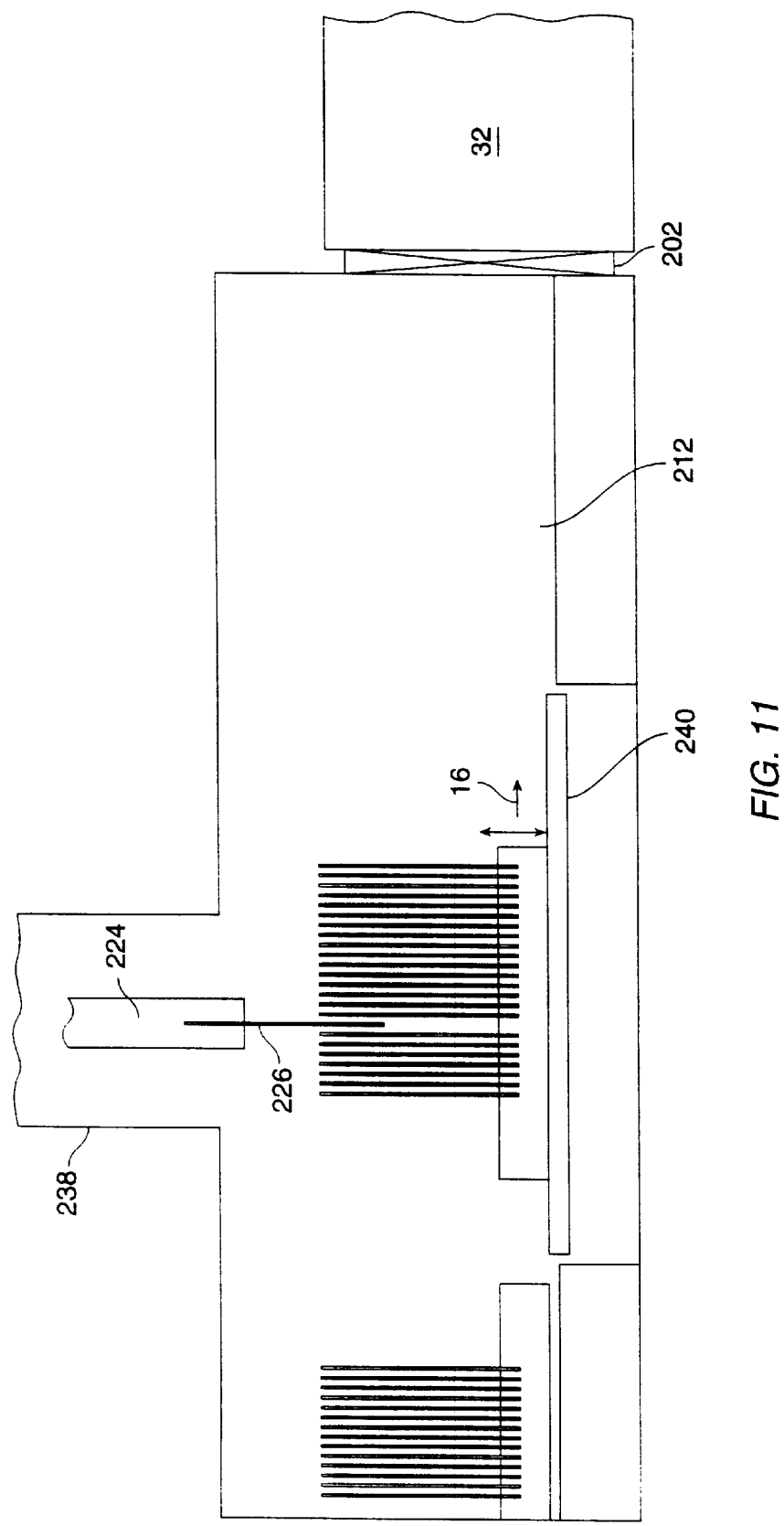

Referring now to FIG. 11, an alternative arrangement for loading and unloading individual substrates onto the spider gripper makes use of a cassette lift/advance table 240 which lifts the batch of cassettes up to the gripper mechanism. The specific substrate selected from the batch is again determined by the position of the cassette along batch path 16 as described above. Clearly, a wide variety of alternative load and unload mechanisms may be used.

Once a batch of substrates has been sputtered with both an underlayer and a magnetic layer, and after each of the sputtered substrates has been reloaded back into the cassette, the cassette is then advanced along the batch path to the cooling station 32. As described above, the cooling station 32 preferably matches the metals deposition environment prior to opening the gate valve 202, so that the metals deposition environment is not disturbed.

As was mentioned above, carbon deposition station 210 can be generally similar in arrangement to the metals deposition station. However, carbon overcoats generally do not require individual preheating of the disks. Additionally, carbon generally provides a lower sputtering yield than metals, and may benefit form a different sputtering gas and pressure. Fortunately, protective carbon overcoats may be thinner than the associated underlayers and magnetic layers of a multi-layer thin film magnetic recording media. Hence, in some embodiments, only one carbon deposition chamber need be provided. Alternatively, a plurality of carbon deposition stations may be provided about the circular substrate path of the carbon deposition system. In other words, each substrate may first have a thin layer of carbon deposited at a carbon deposition chamber positioned in the same location as pre-heat chamber 214 of metals deposition station 208. Additional carbon deposition systems may be deployed at the locations of underlayer chamber 216 and magnetic layer 218, so that the total carbon overcoat is deposited in three layers. Clearly, a deposition station may have more or fewer than three process chambers disposed about the circular substrate arc.

In a particularly preferred embodiment, the overcoat is deposited in the form of a highly tetrahedral amorphous diamond-like carbon using an ion beam source or a filtered cathodic arc as more fully explained in co-pending U.S. Provisional Patent Application Ser. No. 60/018,793, filed May 31, 1996, the full disclosure of which is incorporated herein by reference. Advantageously, the carbon deposition environment and metals deposition environment may be maintained simultaneously and separately by environmental control systems of the two deposition stations.

Figure 12:
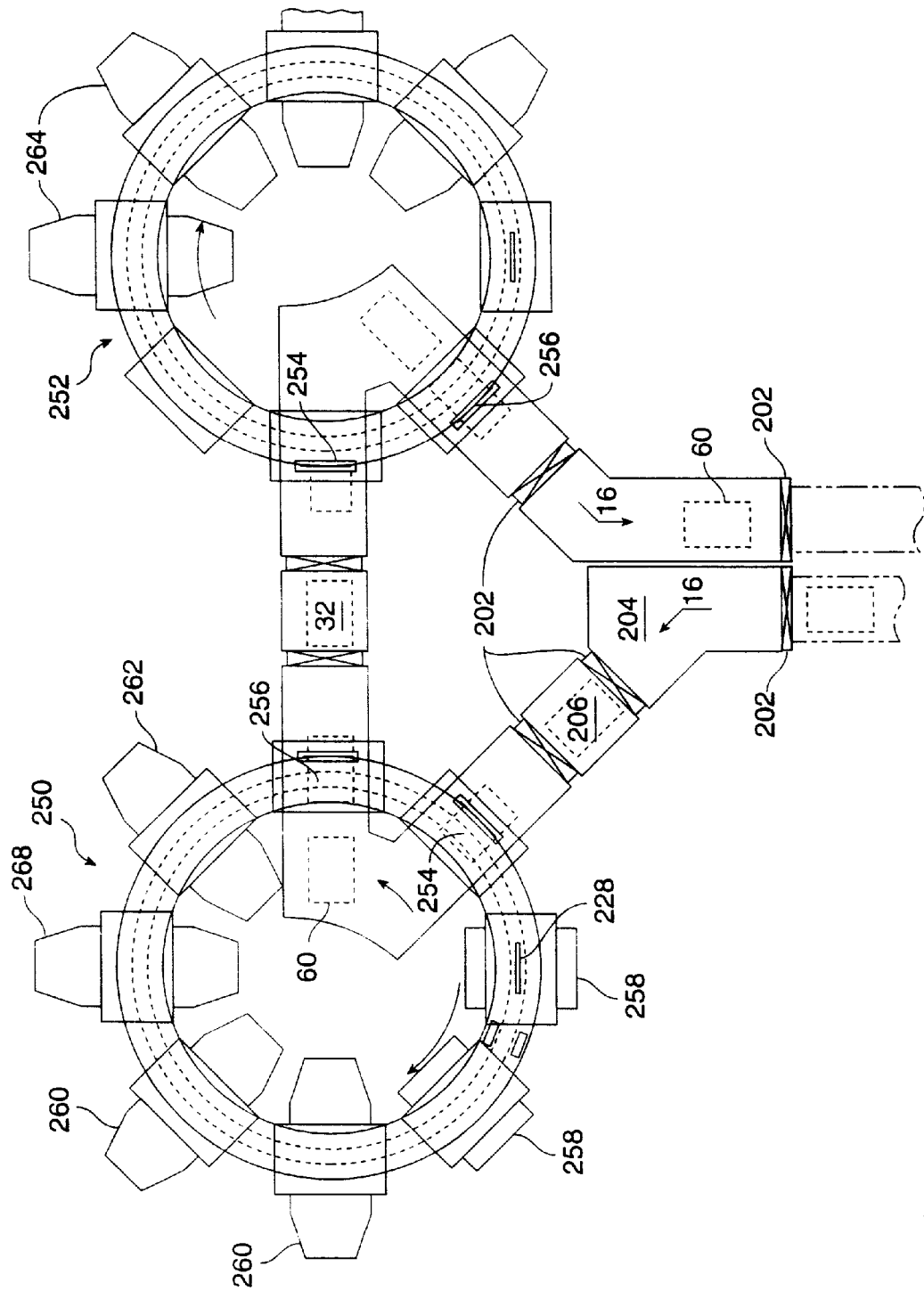
FIG. 12 illustrates a plan view of another embodiment of the deposition system of the present invention, in which the substrates pass along a horizontal arc through a plurality of deposition chambers at each deposition station.

Referring now to FIG. 12, a still further embodiment of a sputtering system according to the present invention includes horizontal plane metals deposition station 250 and a similar horizontal plane carbon deposition station 252. Each of these horizontal plane deposition stations includes an interchamber substrate transfer mechanism having a rotating spider, the spider here translating the individual substrates 228 along a horizontal arc. The horizontal spiders include eight grippers, the depositions stations each having six processing chambers, a disk load position 254, and a disk unload position 256. Hence, while one gripper is being loaded using one load system, an alternate gripper may be unloaded with an alternate unload system, without any interference between these two separate operations. This still leaves six deposition chamber stations available for individual processing of the substrates.

While it is possible to use less than all six of the deposition chamber positions disposed about each horizontal deposition station, it will often be advantageous to include a deposition system at each chamber to maximize the throughput of the entire deposition system, so that the layer structure is built up with several sublayers. Alternatively, batch path 16 may be arranged at different angles by including fewer than six individual substrate processing stations. For example, if only three process stations are required, the unload position 256 may be disposed opposite load position 254, so that the batch path continues straight through the horizontal plane deposition station.

In the embodiment illustrated, horizontal metals deposition station 250 includes two substrate heat systems 258, two underlayer systems 260, and two magnetic layer deposition systems 262. Each of these systems operates at a substantial uniform gas pressure and composition, the station requiring only a single environmental control system. Depending on the desired thickness and the sputtering yield of the underlayer and magnetic layer materials, three underlayer deposition systems and a single magnetic layer system might be used, heating might be performed by a single heat system, or these systems may otherwise be rearranged and reorganized as desired.

Horizontal carbon deposition station 252 includes only a single type of deposition system, carbon deposition system 264. To allow the several carbon deposition systems to operate simultaneously, and possibly also to enhance the quality of the carbon film deposited, the carbon is deposited as a series of four carbon layers.

Generally, the circular spider arrangement of the horizontal deposition stations 250, 252, and of the vertical deposition stations 208, 210 enhance the throughput of the deposition system by allowing multiple parallel deposition processes to be accomplished simultaneously. Each of the individual substrate processing systems may also be configured with a pass-through chamber, reducing the complexity of the spider actuation system. By continuously operating the parallel heating, underlayer sputtering, and magnetic layer sputtering chambers, and by passing through each of these chambers on a circular spider, such a system should be capable of sputtering over 1,000, and possibly up to 2,000 disks per hour. With increasing volumes of disks being manufactured by the industry, the higher throughput rate becomes more valuable, as it reduces the number of systems needed to produce a given volume of disks. The optimum number of sputtering machines for a disk manufacturing plant is generally believed to be greater than one or two (to ensure adequate flexibility), but not more than about 10 (because of the increase in maintenance, operation, and capital costs).

To maximize the benefit of the horizontal and vertical deposition systems illustrated in FIGS. 10 and 12, and to maintain a high quality serial deposition process, the spider will rotate each disk to each of the processing positions, at which the spider holds the disk stationary while processing, as described above. Optionally, the sputtering and/or processing systems may be continuously run, possibly at reduced power, while the disks are rotated from one position to the next. Preferably, the amount of material deposited during transition from one station to the next is less than ten percent of the total deposition for each layer.

Although the present invention has been described in some detail by way of illustration and example, for purposes of clarity of understanding, it will be obvious that certain changes and modifications may be practiced within the scope of the present invention. For example, multiple sputtering chambers might be disposed side-by-side above the cassette chamber of the sputtering station to simultaneously sputter multiple disks. Additionally, throughout the above descriptions, wherever the term "sputtering" is used to describe the deposition process, it should be understood that any other thin film deposition process could be used within the scope of the present invention. Thus the scope of the present invention should be limited only by the appended claims.

What is claimed is:

1. A thin film deposition system comprising:
   a plurality of deposition stations comprising at least a first and a second deposition station each deposition station including walls defining a batch chamber and a deposition chamber and a mechanism to transfer individual substrates between the batch chamber and the deposition chamber, the walls being couplable to at least one adjacent deposition station so as to sealingly surround a batch path;
   a batch drive system to advance batches of the substrates along the batch path through each deposition station;
   a plurality of valves to pass the batches of substrates, the valves disposed at a beginning of the batch path, at an end of the batch path, and between the deposition stations so that the batch path is isolatable from the surrounding environment, and so that the first and second deposition stations are isolatable from each other.

2. A thin film deposition system as claimed in claim 1, wherein each deposition station further comprises an environmental control system for maintaining a station environment including at least one of pressure, temperature, and gas composition within the batch chamber and within the deposition chamber, the station environment being suitable for thin film deposition.

3. A thin film deposition system as claimed in claim 2, wherein the environmental control systems of first and second deposition stations are capable of providing different environments when the valves isolate the deposition stations for deposition of different film materials.

4. A thin film deposition system as claimed in claim 3, further comprising a batch cooling station along the batch path between first and second deposition stations for cooling the batches of substrates, the environment of the second deposition station having a lower temperature than the environment of the first station, the cooling station having walls defining a batch chamber which is isolatable from the first and second deposition stations.

5. A thin film deposition system as claimed in claim 4, further comprising a batch preheat station disposed along the batch path before the first deposition station for raising the temperature of the batch of substrates, the preheat station having walls defining a batch chamber which is isolatable from the first deposition station.

6. A thin film deposition system as claimed in claim 5, further comprising a batch load station disposed along the batch path before the preheat station and a batch unload station disposed along the batch after the second deposition station, the load and unload stations maintaining isolation of the preheat station and the second deposition station while batches of substrates enter and leave the batch path.

7. A thin film deposition system as claimed in claim 1, wherein the walls of at least one of the plurality of deposition stations defines a plurality of deposition chambers, the deposition chambers of the at least one station having deposition systems adapted for deposition with a common station environment.

8. A thin film deposition system as claimed in claim 7, wherein the substrate transfer mechanism of the at least one deposition station defines a substrate path which enters each deposition chamber through a first opening, and which exits the deposition chamber through a second opening different than the first opening.

9. A thin film deposition system as claimed in claim 8, wherein the substrate path comprises an arc which extends through each deposition chamber.

10. A thin film deposition system as claimed in claim 9, wherein the arc defines a substantially horizontal plane.

11. A thin film deposition system as claimed in claim 9, wherein the arc defines a substantially vertical plane.

12. A thin film deposition system as claimed in claim 9, wherein the walls of the at least one deposition station further define at least one substrate heating chamber along the substrate path to raise the temperature of the substrates prior to deposition.

13. A thin film deposition system comprising:
    a plurality of modular process stations capable of defining a batch path therebetween, each process station having walls defining a batch chamber along the batch path, at least two of the process stations comprising deposition stations, each deposition station further having a deposition chamber disposed off the batch path and a mechanism for transferring individual substrates from the batch path to the deposition chamber for deposition of a film therein;
    a plurality of valves disposable between successive deposition stations and at a beginning and an end of the batch path for passing batches of substrates and isolating the batches of substrates; and
    a batch drive system to advance the batches of substrates along the batch path;
    wherein adjacent process stations along the batch path are sealable to each other so that the batches of substrates arc isolated from a surrounding environment between the beginning and the end of the batch path.

14. A thin film deposition machine as claimed in claim 13, wherein each of the deposition stations are releasably sealable against a plurality of alternative process stations so that a sequence of the process stations along the batch path can be rearranged to deposit alternative film structures on the substrates.

* * * * *